United States Patent [19]

Kozono

[11] Patent Number: 5,434,450
[45] Date of Patent: Jul. 18, 1995

[54] PGA PACKAGE TYPE SEMICONDUCTOR DEVICE HAVING LEADS TO BE SUPPLIED WITH POWER SOURCE POTENTIAL

[75] Inventor: Hiroyuki Kozono, Yokohama, Japan

[73] Assignee: Kabushiki Kaisha Toshiba, Kawasaki, Japan

[21] Appl. No.: 309,550

[22] Filed: Sep. 20, 1994

Related U.S. Application Data

[63] Continuation of Ser. No. 79,602, Jun. 22, 1993, abandoned.

[30] Foreign Application Priority Data

Jun. 23, 1992 [JP]  Japan ................................. 4-164971

[51] Int. Cl.$^6$ ............................................ H01L 27/12
[52] U.S. Cl. ...................................... 257/690; 257/693
[58] Field of Search ............... 257/690, 691, 692, 693, 257/694, 696; 361/392, 400, 405

[56] References Cited

U.S. PATENT DOCUMENTS 4,837,184 6/1989 Lin et al. .......................... 257/690
4,875,138 10/1989 Cusack ............................. 361/405

OTHER PUBLICATIONS

"Development of High Density Down-Sizing PGA by Super Fine Pitch Pattern for High Speed Application", Minoru Miura et. al., The First VLSI Packaging Workshop of Japan, United States Department of Commerce National Institute of Standards and Technology and The Institute of Electrical and Electronics Engineers, Inc., pp. 67–70, Nov. 1992.

Primary Examiner—Lincoln Donovan
Attorney, Agent, or Firm—Finnegan, Henderson, Farabow, Garrett & Dunner

[57] ABSTRACT

A PGA package type semiconductor device comprises an insulating lower package, leads, an insulating upper package, conductive wires, lead pins, and at least one semiconductor chip. The leads to be supplied with a power source potential are formed on the lower package. The upper package having a semiconductor chip-mounting portion at a central portion thereof is fixed to the lower package with the leads interposed therebetween. In the upper package, the conductive wires are formed on the leads with an insulator interposed therebetween. The lead pins vertically project from a peripheral portion of the upper package, and are electrically connected to the conductive wires. At least one semiconductor chip is mounted on the chip-mounting portion of the upper package. The semiconductor chip is connected to the leads by a TAB tape, and connected to the conductive wires by a TAB tape or bonding wires.

9 Claims, 5 Drawing Sheets

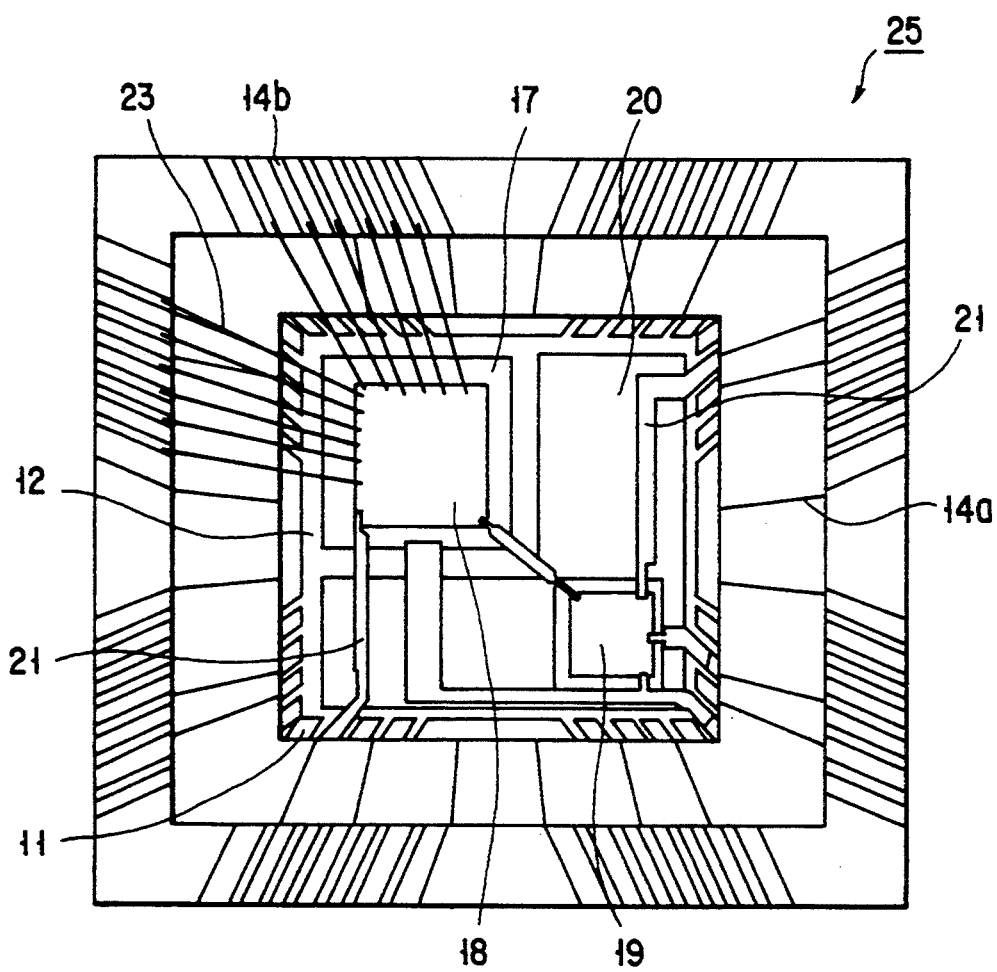
F I G. 3B

PGA PACKAGE TYPE SEMICONDUCTOR DEVICE HAVING LEADS TO BE SUPPLIED WITH POWER SOURCE POTENTIAL

This application is a continuation of application Ser. No. 08/079,602, filed Jun. 22, 1993, now abandoned.

BACKGROUND OF THE INVENTION

1. Field of the Invention

This invention relates to a PGA (Pin Grid Array) package type semiconductor device, and more particularly to a technique for preventing crosstalk noise from occurrence in a PGA package type semiconductor device, which has a plurality of lead pins and operates at high frequency.

2. Description of the Related Art

PGA package type semiconductor devices are disclosed, for example, in "The First VLSI PACKAGING WORKSHOP of Japan" UNITED STATES DEPARTMENT OF COMMERCE NATIONAL INSTITUTE OF STANDARDS AND TECHNOLOGY and THE INSTITUTE OF ELECTRICAL AND ELECTRONICS ENGINEERS, INC. Nov. 30, Dec. 1 and 2, 1992 "DEVELOPMENT OF HIGH DENSITY DOWN-SIZING PGA BY SUPER FINE PITCH PATTERN FOR HIGH SPEED APPLICATION" Miura et at. pp. 67–70.

FIG. 1A is a perspective view, showing a general PGA package type semiconductor device. FIG. 1B is an enlarged plan view, showing that semiconductor chip-mounting portion of the package which is enclosed by broken line 40 in FIG. 1A, and its peripheral portion. As is shown in FIG. 1A, a plurality of pins 31 are arranged on a ceramic body 30 along its peripheral portion. As is shown in FIG. 1B, a portion 32 mounting a semiconductor chip 35 is provided at a central portion of the body 30, and end portions of lead wires 33 extending in the body 30 and connected to the lead pins 31 are exposed around the chip-mounting portion 32. The lead wires 33 each consist of two layers formed in the body 30, so as to be connected to lots of lead pins 31. A chip-mounting metal plate 34 has one surface coated with gold, and the other surface adhered to the chip-mounting portion 32 by means of a conductive adhesive agent. The semiconductor chip 35 is adhered to the gold-coated surface of the chip-mounting plate 34 by means of a conductive adhesive agent. Bonding wires 36 connect the lead wires 33 to a peripheral portion of the gold-coated surface of the chip-mounting plate 34, and also connect the wires 33 to electrodes (not shown) provided on a backside of the semiconductor chip 35. Thus, the electrodes are electrically connected to the lead pins 31.

In the case where the semiconductor chip 35 operates at high frequency, crosstalk noise is liable to occur in an electrical signal passing between each adjacent pair of the lead pins 31, due to capacitive coupling of the lead wires 33 connected by each of the lead pins 31. There is a known technique for preventing occurrence of crosstalk noise by providing another lead pin, to be supplied with a power source potential, between each adjacent pair of the lead pins, thus making it have a crosstalk-shielding function.

However, in the above-described structure, lots of lead pins (specifically, the number of the lead pins is equal to substantially twice the number of electrical signals required) for supplying a power source potential must be employed. Accordingly, where a great number of electrical signals are necessary to realize a multifunctional semiconductor chip, the number of the lead pins for supplying the power source potential must be increased, resulting in an increase in package size.

SUMMARY OF THE INVENTION

It is an object of the invention to provide a PGA package type semiconductor device suitable for sealing a high frequency semiconductor chip therein.

It is another object of the invention to provide a PGA package type semiconductor device having a relatively small number of lead pins and hence a relatively small package size.

It is a further object of the invention to provide a PGA package type semiconductor device capable of restraining crosstalk noise without increasing the number of lead pins.

The above objects can be attained by a semiconductor device comprising: an insulating body; leads formed in the body and to be supplied with a power source potential; conductive wires formed in the body on the leads, with an insulator interposed therebetween; lead pins provided on the body and electrically connected to the conductive wires; and at least one semiconductor chip connected to the leads by a TAB tape, and connected to the conductive wires by at least one of the group including a TAB tape and the group including bonding wires.

According to the above structure, since leads are provided on the conductive wires with an insulator interposed therebetween and are supplied with a power source potential, they shield the wires. Thus, crosstalk noise can be restrained without increasing the number of the lead pins, and hence the package can be made compact. In light of the above, the invention is applicable to a package a high frequency semiconductor chip wherein crosstalk noise is liable to occur.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3B is an enlarged plane view, showing a semiconductor chip-mounting portion shown in FIG. 3A, and its peripheral portion.

DETAILED DESCRIPTION OF THE PREFERRED EMBODIMENTS

Figure 1A:
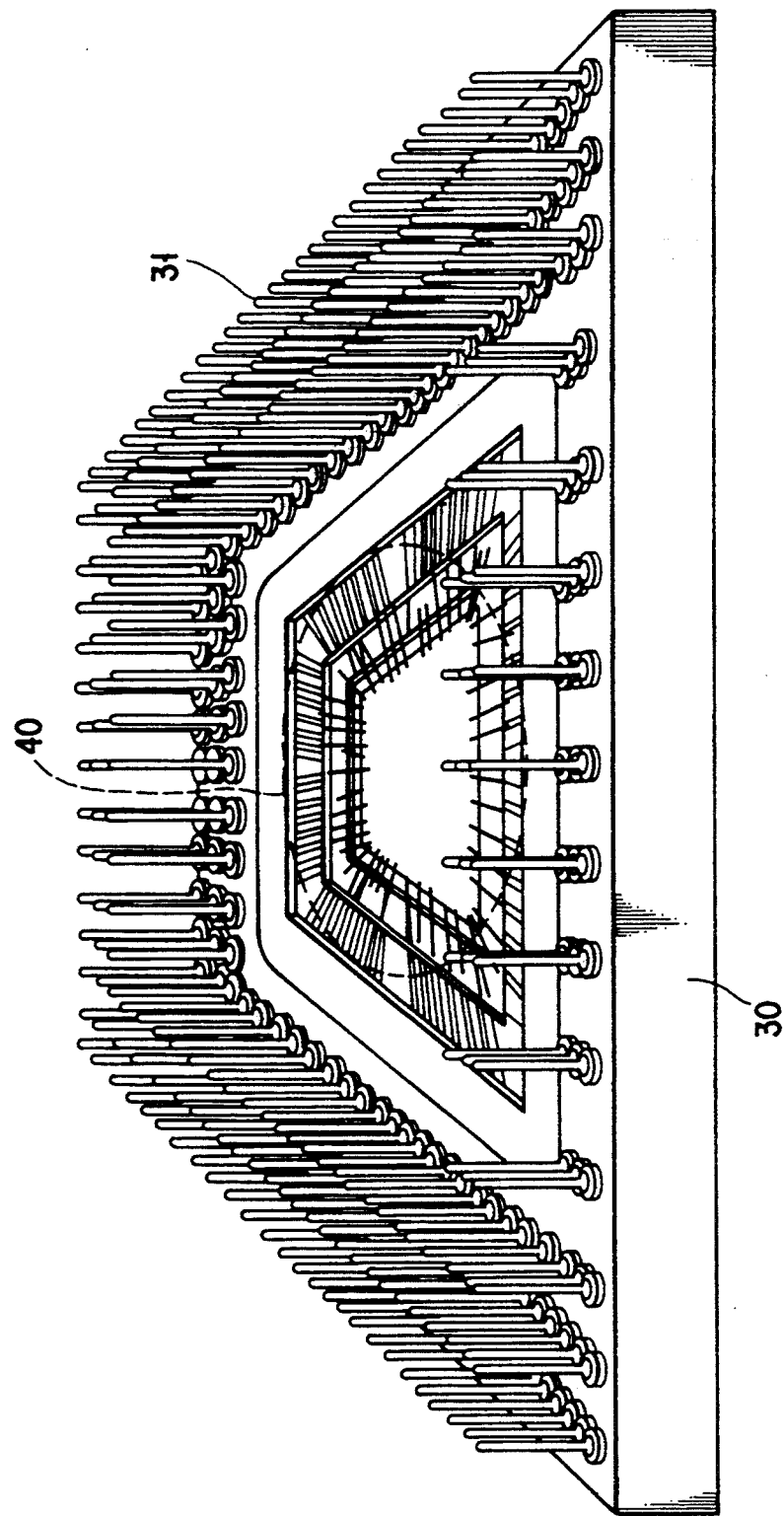
FIG. 1A is a perspective view, showing a conventional PGA package type semiconductor device.
Figure 1B:
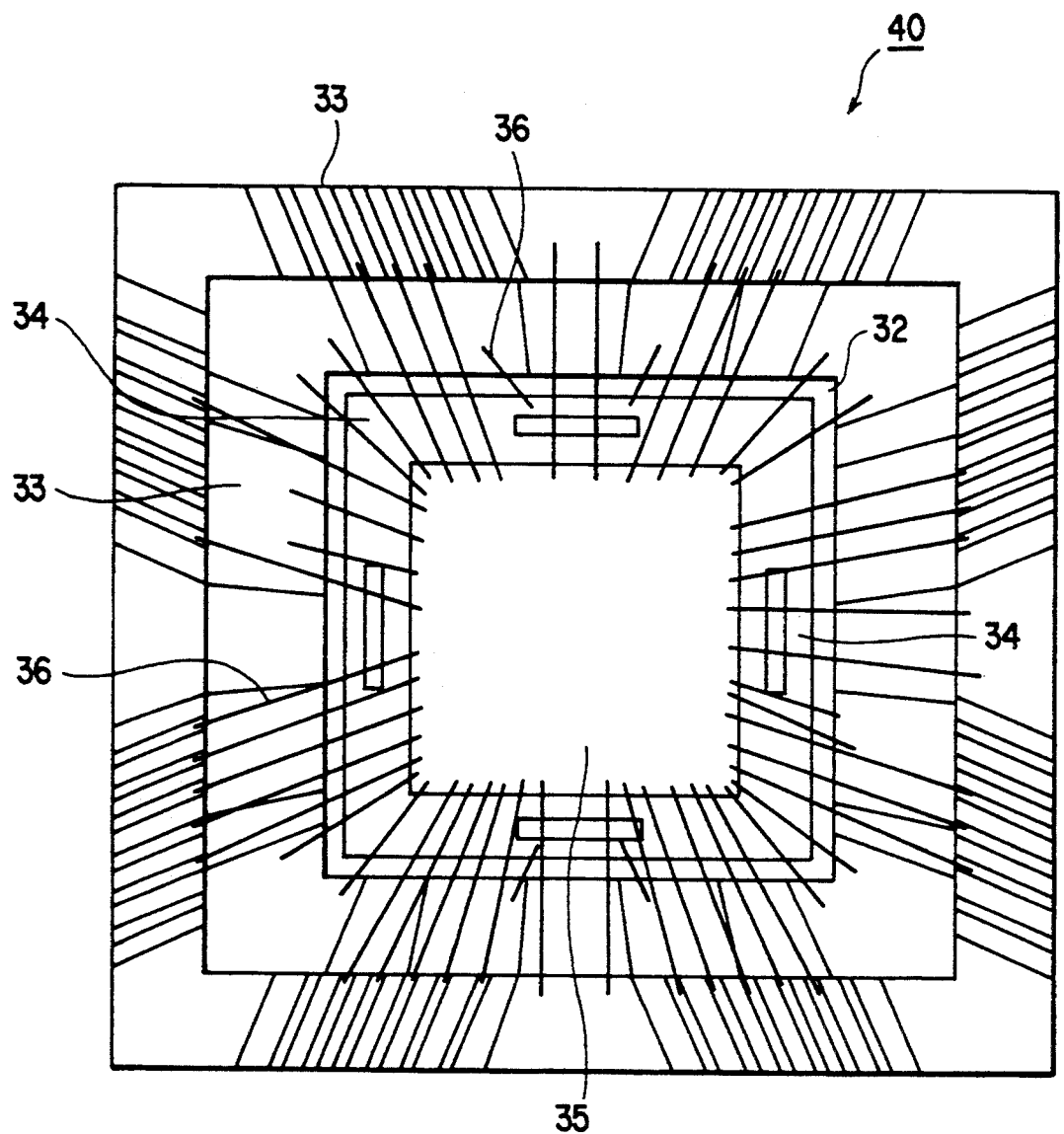
FIG. 1B is an enlarged plane view, showing a semiconductor chip-mounting portion shown in FIG. 1A, and its peripheral portion.
Figure 2:
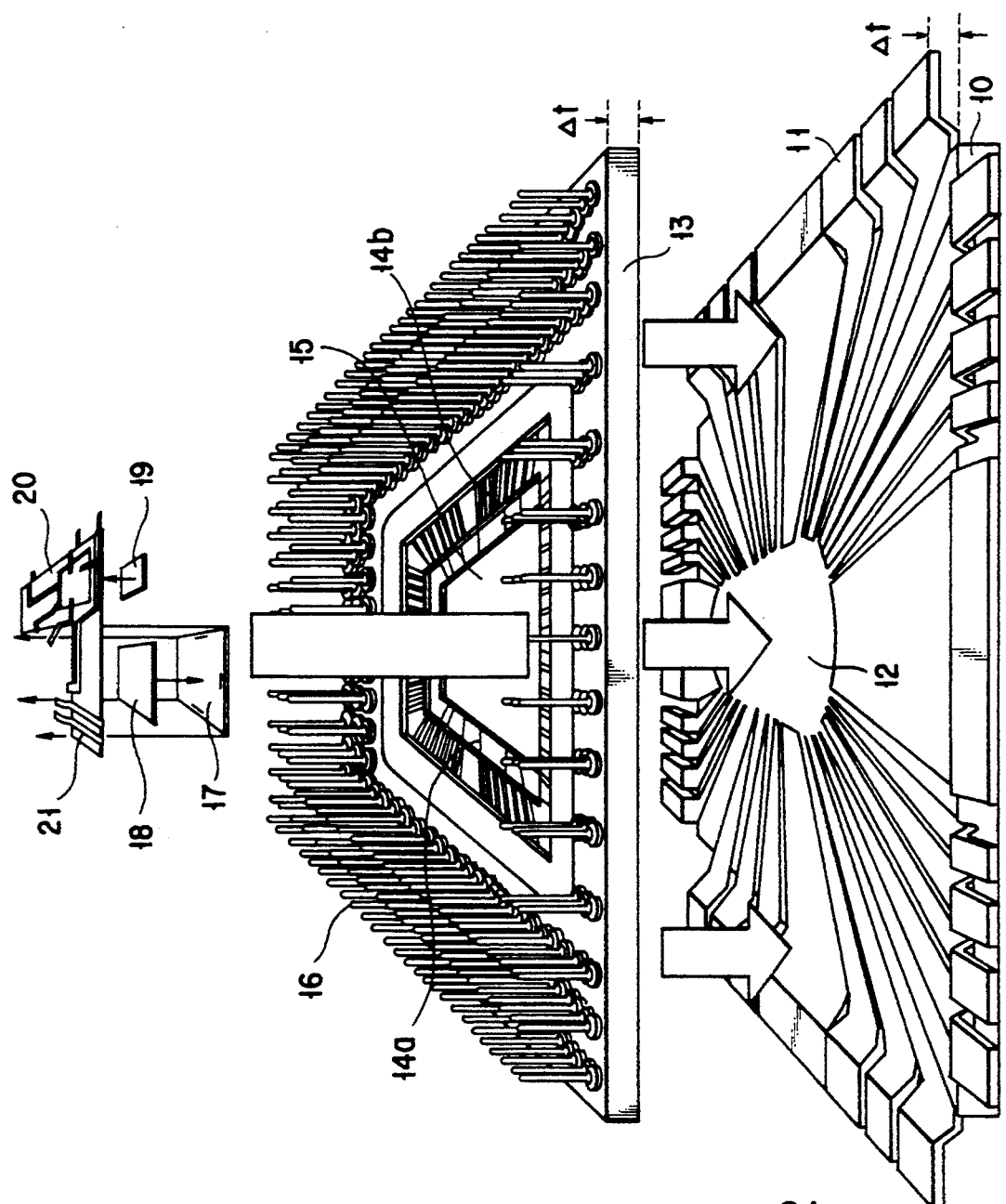
FIG. 2 is an exploded perspective view of a semiconductor device according to an embodiment of the invention, showing a state before assemblage.
Figure 3A:
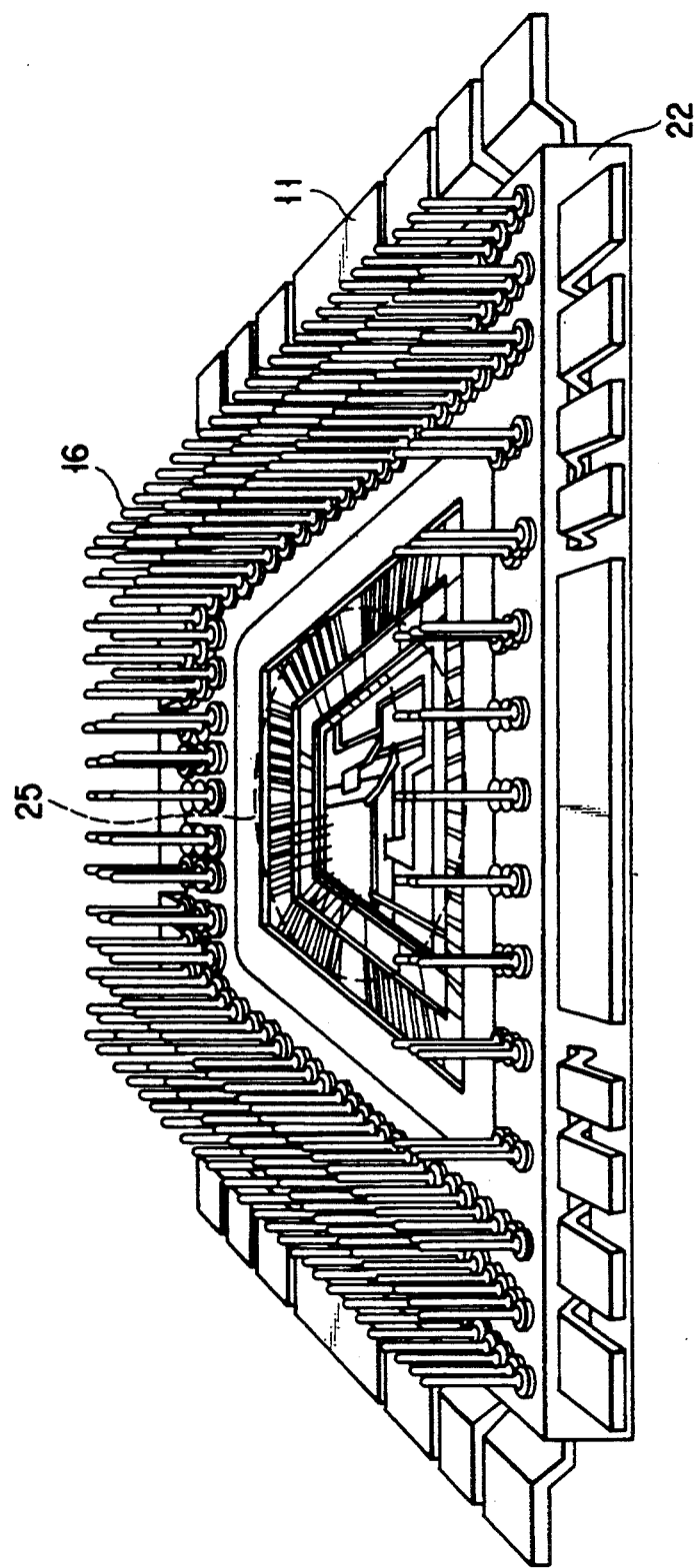
FIG. 3A is a perspective view of the semiconductor device according to the embodiment of the invention, showing a state after assemblage.

FIG. 2 is a perspective view of a PGA package type semiconductor device according to an embodiment of the invention, showing a state before assemblage, and FIG. 3A a perspective view of the same, showing a state after assemblage. FIG. 3B is an enlarged plane view, showing a semiconductor chip-mounting portion enclosed by broken line 25 in FIG. 3A, and its peripheral portion. As is shown in FIG. 2, leads 11 are provided on a lower ceramic body 10. A central portion of the body 10 serves as a semiconductor chip-mounting portion 12, and the inner ends of the leads 11 surround the chip-mounting portion 12. The outer end of each of the leads 11 extends upward from the upper surface of the lower body 10 by $\Delta t$ corresponding to the thickness of an upper ceramic body 13, and then horizontally extends outward.

As in the case of the conventional PGA package, conductive wires 14a and 14b each consisting of two or more layers are provided in the upper body 13. An opening (window) 15 is formed in a central portion of the upper body 13, and an edge of the opening 15 has a two-stepped cross section. The conductive wires 14a and 14b are exposed on the stepped portions of the edge, respectively. The size of the opening 15 is set such that a bump is formed on an inner end of each lead 11 and the lead is exposed through the opening 15, when the upper body 13 is placed on the lower body 10. Lead pins 16 project from a peripheral portion of a major surface of the upper body 13 and form tipple enclosures around the opening 15. Each lead pin 16 is electrically connected to corresponding conductive wires 14a and 14b on the upper body 13.

A metal chip-mounting plate 17 having one surface coated with gold is made of a material of a high thermal conductivity, and has a size larger than a semiconductor chip 18. The semiconductor chip 18 consists of a linear array or a gate array. A filmy circuit board 20 has a size smaller than the opening 15, and has cut-out portions for receiving semiconductor chips 18 and 19. Conductive wires 21 are formed on the filmy circuit board 20 such that the both opposite ends of each wire 21 project outward of the board 20. At least one of the chips 18 and 19 is a high frequency semiconductor chip.

Then, a method of assembling the semiconductor device in the state shown in FIG. 2 will be explained with reference to FIGS. 3A and 3B. First, the lead-formed surface of the lower body 10 is adhered, by an insulating adhesive agent, to the surface of the upper body 13 which is opposite to the lead pin-formed surface, to form an integrated body 22. Thereafter, the surface of the chip-mounting plate 17 which is opposite to the gold-coated surface is adhered to the chip-mounting portion 12 of the package. Subsequently, the semiconductor chip 19 is adhered to the portion 12. Then, the semiconductor chip 18 is mounted on the gold-coated surface of the plate 17 by use of a conductive adhesive agent. Bumps are formed on electrodes on the chips 18 and 19, the inner ends of the leads 11, the conductive wires 14a exposed on the lower step of the opening 15, and gold-coated surface of the plate 17. Thereafter, TAB (Tape Automated Bonding) is performed to thermally press to the bumps end portions of the conductive wires 21 formed on the filmy circuit board 20. Thus, the chips 18 and 19 are connected to each other, to the conductive wires 14a exposed on the lower step of the opening 15, and also to the leads 11, respectively. Further, the coated surface of the chip-mounting plate 17 is connected to the leads 11, and hence electrodes provided on the backside of the chip 18 are connected to the leads 11. Subsequently, the remaining electrodes on the chip 18 are connected by bonding wires 23 to the conductive wires 14b exposed on the upper step of the opening 15. Lastly, the opening 15 is sealed by a metal cover (not shown).

Since in the above structure, the leads 11 are located under the conductive wires 14a and 14b, and a ceramic member (i.e., an insulator) constituting the upper body 13 is interposed therebetween, the leads 11 can have a shielding function when they are supplied with a power source potential. Accordingly, crosstalk noise can be reduced even in a PGA package type semiconductor device having the high frequency semiconductor chip 18 or 19 and a plurality of lead pins 16. In other words, in this case, lead pins conventionally provided between lead pins for electrical signals so as to perform shielding when they are supplied with a power source potential can be omitted, thus reducing the number of required lead pins and the size of the package. Moreover, even when the number of electrical signals is increased as a result of increasing semiconductor chips mounted in the package or of providing highly functional semiconductor chips therein, it suffices if only lead pins for electrical signals are increased (i.e., it is not necessary to increase lead pins for shielding).

In addition, since the above-described TAB can simultaneously perform bonding at many portions, the number of the bonding steps can be smaller than in the case of wire bonding. Accordingly, the throughput can be increased, and also bonding error can be reduced, thereby enhancing the yield and reducing the manufacturing cost. Further, since the leads used at the time of the TAB are fixed to the filmy circuit board 20, they do not contact each other unlike bonding wires, and therefore semiconductor chips can easily be connected to each other. Accordingly, a plurality of semiconductor chips can be mounted on the chip-mounting portion 12, and hence there can be provided a multi-chip type semiconductor device which has a plurality of semiconductor chips including a gate-array type semiconductor chip or a linear-array type semiconductor chip, thus enhancing the degree of freedom in designing electrical circuits for realizing the functions of the semiconductor device. Further, in order to mount in a package semiconductor chips of various types (e.g. a gate array type and a linear array type) with the number of each type of chips being small, it is not necessary to change the basic structure of the package (especially, the arrangement of inner leads), but only necessary to change the wiring pattern on the TAB tape. Thus, semiconductor chips of different types can easily be mounted in a single package. However, since the leads used at the time of the TAB are thin, they can be broken when bonding is performed between the steps of the edge portion of the opening 15. To avoid this, in the embodiment, the bonding wires 23 are used to connect the conductive wires 14b, exposed on the upper step, to the electrodes on the chip 18.

Since the body 22 is formed by attaching the upper body 13 to the lower body 10, the design of the leads 11 formed on the lower body 10 can easily be changed, and therefore semiconductor chips to be packaged in a multi-chip type semiconductor device can more widely be selected.

The invention is not limited to the above-described embodiments, but can be modified in various manners. For example, although the lower body 10 is made of a ceramic member, it may be made of another insulator such as a resin. Moreover, the leads 11 may be adhered to the upper body 13 by means of an insulating adhesive agent, and the adhered portions of the leads be sealed by a resin. In place of the lower body 10 and leads 11, an insulating substrate (e.g., a flexible substrate) made of a resin, etc., and having a surface with a pattern made of a conductive material may be adhered to the upper body 13 to form the body 22.

What is claimed is:

1. A semiconductor device comprising:
    an insulating body having a surface extending in a plane normal to an axis;
    leads formed in the body and to be supplied with a power source potential;
    conductive wires formed in the body in alignment with and axially spaced from the leads and insulated from the leads;
    lead pins provided on the body and electrically connected to the conductive wires; and
    at least one semiconductor chip connected to the leads by a TAB tape, and connected to the conductive wires by at least one of a group including a TAB tape and a group including bonding wires.

2. The semiconductor device according to claim 1, wherein the at least one semiconductor chip includes a plurality of semiconductor chips, and the semiconductor chips are connected by the TAB tape.

3. The semiconductor device according to claim 2, wherein at least one of the semiconductor chips is one of a gate array type semiconductor chip and a linear array type semiconductor chip.

4. The semiconductor device according to claim 1, wherein both the body and the insulator are made of a ceramic member.

5. A PGA package type semiconductor device comprising:
    an insulating lower package;
    leads provided on the lower package and to be supplied with a power source potential;
    an upper package fixed to the lower package with the leads interposed therebetween, and having a semiconductor chip-mounting portion at a central portion thereof;
    conductive wires formed in the upper package in alignment with and spaced from the leads and insulated from the leads;
    lead pins provided around the chip-mounting portion on the upper package, and electrically connected to the conductive wires; and
    at least one semiconductor chip connected to the leads by a TAB tape, and connected to the conductive wires by at least one of a group including a TAB tape and a group including bonding wires.

6. The PGA package type semiconductor device according to claim 5, wherein the at least one semiconductor chip includes a plurality of semiconductor chips, and the semiconductor chips are connected by the TAB tape.

7. The PGA package type semiconductor device according to claim 6, wherein at least one of the semiconductor chips is one of a gate array type semiconductor chip and a linear array type semiconductor chip.

8. The PGA package type semiconductor device according to claim 5, wherein both the body and the insulator are made of a ceramic member.

9. The PGA package type semiconductor device according to claim 5, wherein the conductive wires are laminated in the upper package, and insulated from each other.

* * * * *